US006197659B1

United States Patent
Liu

(10) Patent No.: US 6,197,659 B1
(45) Date of Patent: Mar. 6, 2001

(54) DIVOT FREE SHALLOW TRENCH ISOLATION PROCESS

(75) Inventor: Jacsou Liu, Hsinchu Hsien (TW)

(73) Assignee: Mosel Vitelic, Inc., Hsin-Chu (TW)

( * ) Notice: Subject to any disclaimer, the term of this patent is extended or adjusted under 35 U.S.C. 154(b) by 0 days.

(21) Appl. No.: 09/443,945

(22) Filed: Nov. 19, 1999

(30) Foreign Application Priority Data

Mar. 9, 1999 (TW) .................................. 88103640

(51) Int. Cl.⁷ .................................................. H01L 21/76
(52) U.S. Cl. .......................... 438/424; 438/221; 438/296
(58) Field of Search .................................. 438/424, 221, 438/296, 359

(56) References Cited

U.S. PATENT DOCUMENTS

| 5,433,794 | 7/1995 | Fazan et al. | 148/33.3 |
|---|---|---|---|
| 5,440,160 | 8/1995 | Vinal | 257/327 |
| 5,506,168 | 4/1996 | Morita et al. | 437/67 |
| 5,674,775 | 10/1997 | Ho et al. | 437/67 |
| 5,712,185 | 1/1998 | Tsai et al. | 437/67 |
| 5,719,085 | 2/1998 | Moon et al. | 438/424 |
| 5,786,262 | 7/1998 | Jang et al. | 438/424 |
| 5,795,811 | 8/1998 | Kim et al. | 438/404 |
| 5,801,082 | 9/1998 | Tseng | 438/424 |
| 5,801,083 | 9/1998 | Yu et al. | 438/424 |
| 5,807,789 | 9/1998 | Chen et al. | 438/714 |
| 5,863,827 | 1/1999 | Joyner | 438/425 |
| 5,891,787 * | 4/1999 | Gardner | 438/424 |
| 5,895,254 | 4/1999 | Huang et al. | 438/424 |
| 5,895,258 | 4/1999 | Song | 438/444 |
| 6,114,217 * | 9/2000 | Park | 438/424 |

* cited by examiner

Primary Examiner—Tuan H. Nguyen
Assistant Examiner—David S Blum
(74) Attorney, Agent, or Firm—Chien-Wei (Chris) Chou; Oppenheimer Wolff & Donnelly LLP

(57) ABSTRACT

An improved process of fabricating a shallow trench isolation structure is provided. A semiconductor substrate is provided and an insulating layer is formed over the substrate. A nitride masking layer is formed over the insulating layer. The nitride masking layer and the insulating layer are patterned and etched to expose a portion of the substrate, and to expose edges of the nitride masking layer and the insulating layer. The exposed portion of the substrate substantially defines boundaries of the isolation structure. A first oxide layer is deposited superjacent the exposed portion of the substrate, and over the nitride masking layer. A removing step includes removing portions of the first oxide layer lying over the nitride masking layer, a central portion of the first oxide layer superjacent the substrate, and a portion of the substrate to form a trench, leaving an oxide spacer disposed between the exposed edges of the nitride masking layer and the insulating layer, and the edge of the trench. Next, a second oxide layer is formed on the interior surface of the trench. An insulating material is then deposited into the trench, over the spacer, and over the first oxide layer to form a third oxide layer. The third oxide layer is planarized to expose the nitride masking layer. The nitride masking layer is removed, and then the insulating layer is removed. Finally, the third oxide layer is smoothed to form the trench isolation structure.

22 Claims, 6 Drawing Sheets

DIVOT FREE SHALLOW TRENCH ISOLATION PROCESS

BACKGROUND OF THE INVENTION

1. Field of the Invention

The present invention relates generally to processes for forming isolation regions in semiconductor devices, and more specifically to a process of fabricating a shallow trench isolation (STI) structure in a semiconductor device.

2. Description of the Prior Art

As semiconductor device dimensions are decreased, and device density increases, it becomes more difficult to efficiently and reliably fabricate isolation structures for separating active areas of the device. One common method of forming isolation structures for semiconductor devices is referred to as localized oxidation of silicon (LOCOS). However, the limits of the standard LOCOS process have motivated the development of new isolation processes. A trench isolation process is now widely used as it uses a fully recessed oxide, has no bird's beaks, is fully planar, and does not suffer from the field oxide thinning effect. However, the trench isolation process still suffers from problems such as "corners" effects at the trench edge that can increase device leakage current, especially when the trench is recessed.

U.S. Pat. No. 5,733,383, issued to Fazan, et al. on Mar. 31, 1998 discloses a method of using pacers used to form isolation trenches with improved corners. The trench for isolating active devices on a semiconductor substrate, is formed by creating a trench which has a peripheral edge, and disposing an isolating material in the trench. The isolating material extends over the peripheral edge of the trench, thereby covering at least a portion of the substrate surrounding the trench, and substantially limiting leakage of the active devices disposed on the substrate.

Figure 1:
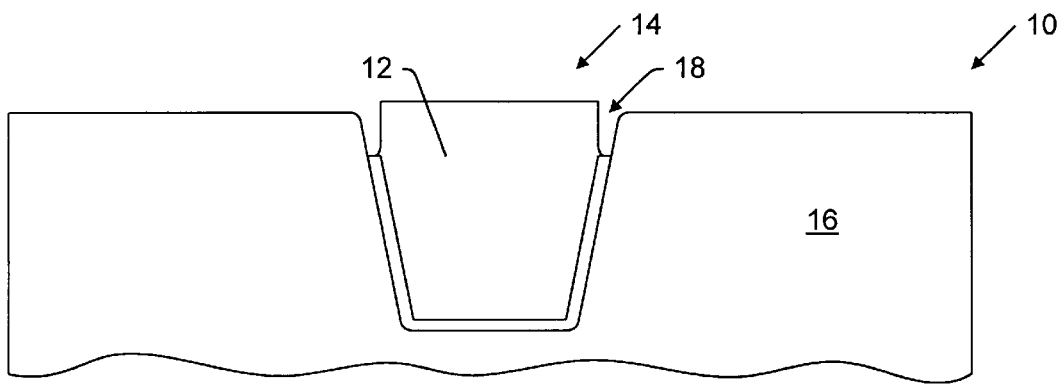

FIG. 1 shows a cross-sectional view at 10 of a typical prior art shallow trench isolation (STI) structure including isolation material 12 deposited within a trench 14 formed in a semiconductor substrate 16, the STI structure 10 having a recess, or divot, 18 formed between the isolation material 12 and the edge of the trench 14. When the isolation material 12 is etched, the recess, or divot, 18 frequently results wherein little or no isolating material 12 remains at the "corners" of the trench 14. The exposed "corners" are potential points of current leakage between regions of the active areas (not shown) of. The current leakage and other effects of the exposed corners are referred to as "corners effects". As is well understood in the art, the recess has a negative impact on $I_D V_G$ characteristics of STI junctions.

Many prior art processes have been developed for manufacturing STI structures wherein the corners effect is minimized. FIGS. 2A through 2H are cross-sectional views illustrating a progression of manufacturing steps in accordance with an exemplary prior art process of manufacturing an STI structure having a smooth trench profile achieved by forming spacers around the periphery of the trench to form a dome like structure over the trench.

Figure 2A:
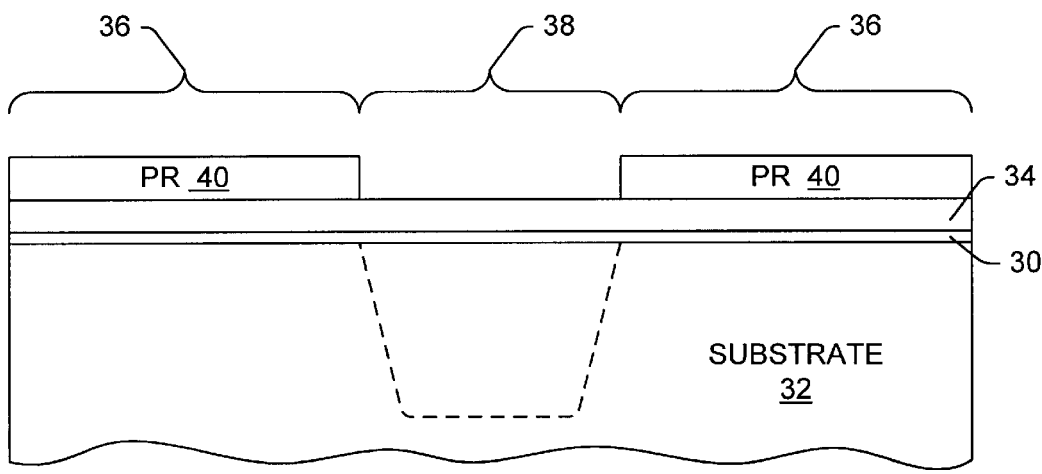

Referring to FIG. 2A, an insulating layer 30 is formed over a semiconductor substrate 32 in accordance with initial steps in accordance with the prior art process of manufacturing the STI structure. The insulating layer 30 is typically formed using an oxide, commonly referred to as a pad oxide. However, other suitable insulating materials are also known to be used. A nitride masking layer 34 is disposed over the insulating layer 30. Although the masking layer 34 is usually formed using a material having insulative properties (e.g., silicon nitride), conductive materials such as polysilicon and polysilicon/nitride may also be used to form the masking layer 34.

Initial steps in defining active areas 36 and trench areas 38 of the semiconductor substrate 32 include: applying a photo-resistive mask 40 over the nitride masking layer 34; etching to remove portions of the nitride masking layer 34 and insulating layer 30 in the trench area 38; etching to remove portions of the nitride masking layer 34 and insulating layer 30 in the trench area 38; etching further to remove a portion of the substrate 32; and subsequently removing the photo-resistive mask 40. Reactive ion etching (RIE) is typically used in this phase of the STI process to etch portions of layers 30 and 34, and portions of the substrate 32.

Figure 2B:
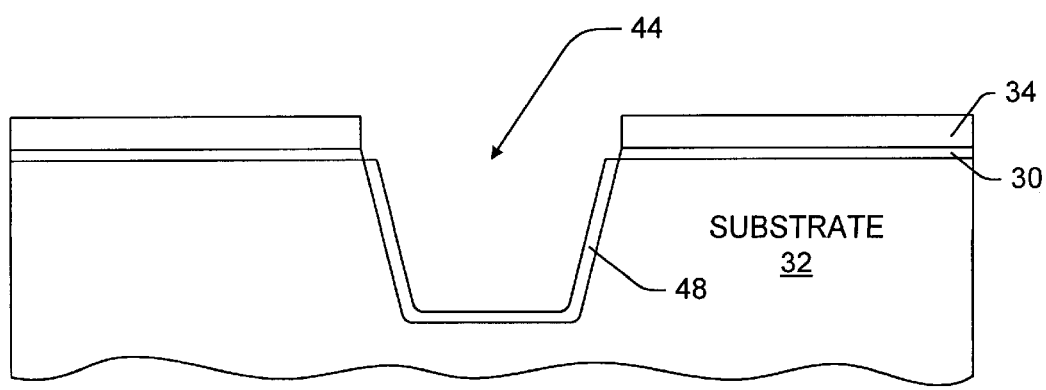

FIG. 2B shows a cross-sectional view of a trench 44 formed in the substrate 32 as a result of the step of etching an exposed portion of the substrate 32 in the trench area after the exposed portions of layers 30 and 34. The trench 44 has sidewalls which may be substantially vertical to the substrate 32, or which may be slightly sloped as shown. A first oxide layer 48 may be grown or deposited in the trench 44 via a rapid thermal oxidation (RTO) process, thereby lining the sidewalls and bottom of the trench 44 and providing greater resistance to cracking, and for passivating the trench sidewalls.

Figure 2C:
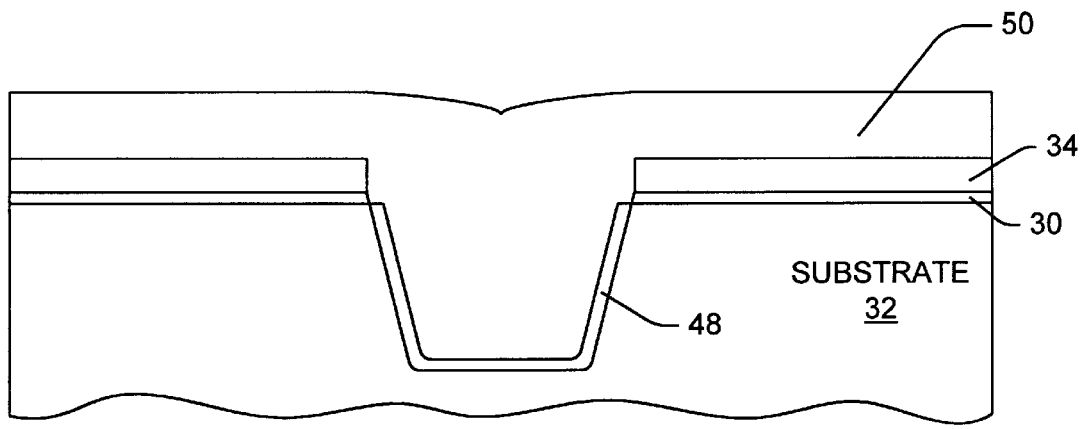

Referring to FIG. 2C, a second oxide layer 50 is deposited in the trench 44, and over the remaining portions of the insulating layer 30, and nitride masking layer 34. The second oxide layer 50 functions as an insulator, thereby providing isolation of the various electrical devices which may be fabricated on the substrate 32. The second oxide layer 50 is typically formed by a thick layer of oxide such as tetraethyl orthosilicate (TEOS), CVD-oxide, borophosphosilicate glass (BPSG), nitride, a combination thereof, or a similar insulating material. Other materials have also been found to be effective for use in isolation trenches, such as, for example, a combination of nitride and oxide, or polysilicon which has been oxidized.

Figure 2D:
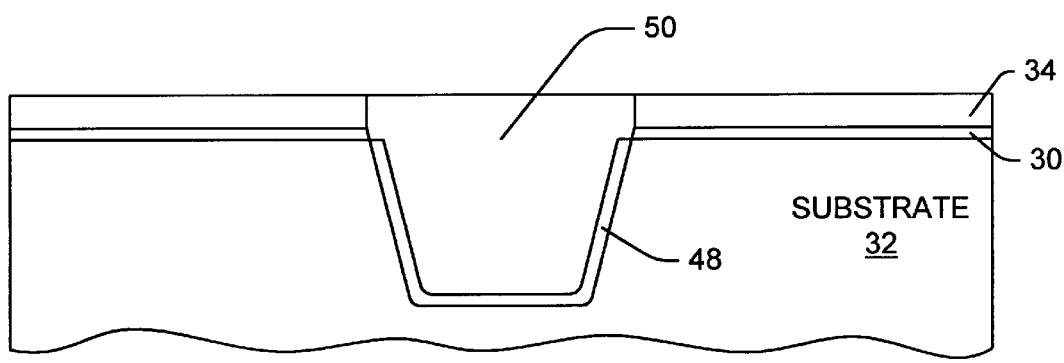
Figure 2E:
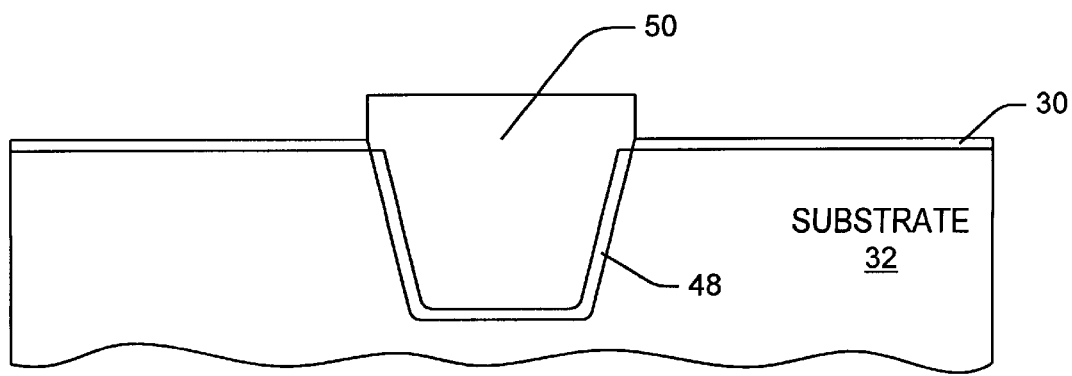

FIG. 2D shows a cross-sectional view of the STI structure of FIG. 2C after planarization steps have been performed. Planarization may be accomplished by any of a variety of suitable methods, such as chemical-mechanical polishing (CMP), dry etching, or a combination thereof. As a result of the planarization steps, the top surface of the nitride masking layer 34 is exposed. The structure of FIG. 2E results after the nitride masking layer 34 is removed via a wet etching process. A portion of the second oxide layer 50 protrudes above the substrate 32 after the nitride masking layer 34 has been etched away. The protruding portion of the second oxide layer 50 has substantially vertical sides. If the insulating layer 30 were to be removed at this point using a wet etching method, a recess would be formed as shown in FIG. 1.

Figure 2F:
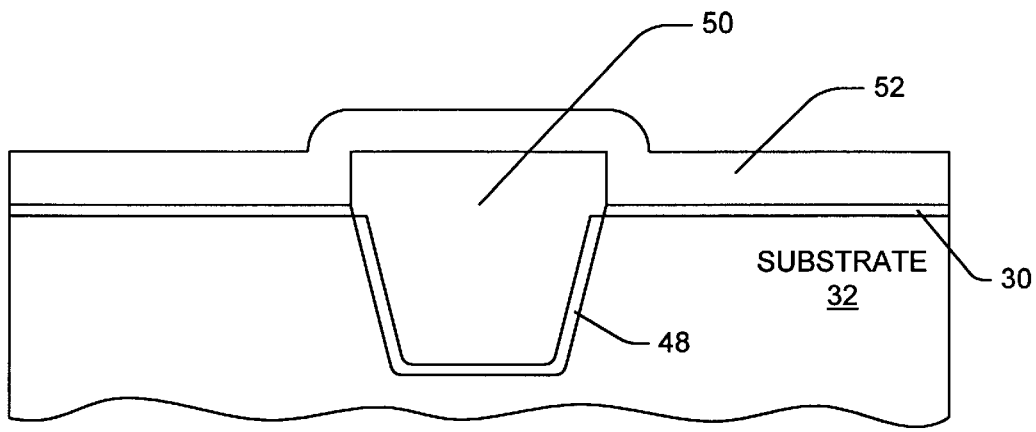
Figure 2G:
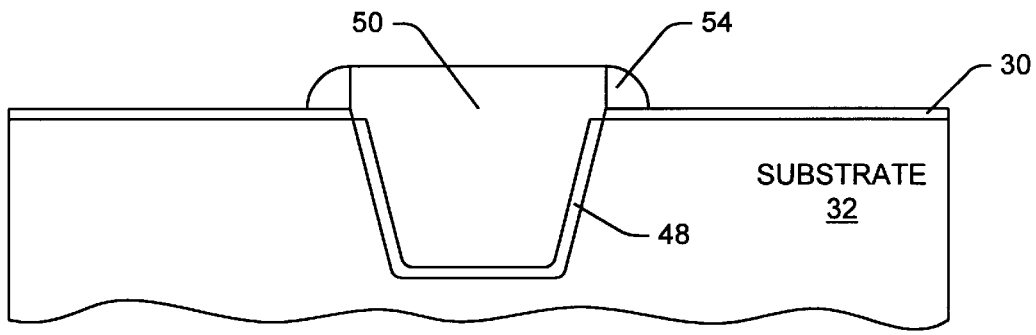

In order to avoid the recess and accompanying corners effects, a third oxide layer 52 may be deposited over the insulating layer 30 and second oxide layer 50 as shown in FIG. 2F. Typically, the material used to form the third oxide layer 52 has chemical properties which are substantially similar to those of the material used to form the second oxide layer 50. The third oxide layer 52 is usually deposited in accordance with a conventional chemical vapor deposition (CVP) method. The third oxide layer 52 may be formed by depositing TEOS, nitride with TEOS, or borophosphosilicate glass (BPSG). CVD-oxide may be employed. Other suitable deposited dielectrics can be used, as well as polysilicon which is subsequently oxidized. The third oxide layer 52 usually conforms to the profile of the structure, as shown in FIG. 2F. The conformal properties of the third oxide layer 52 enable the self-alignment of spacers as further described below.

A partial spacer etching step is performed, typically using dry etching, to remove all but a portion of the third oxide layer 52 thereby forming a spacer 54 surrounding the trench. Dry etching is used because it tends not to damage the active area regions which may also be disposed on the substrate. The chemical properties of the spacers 54 are substantially similar to those of the material used to form the second oxide layer 50. The spacers 54 are located on the surface of the substrate 32 at the corners of the trench, and are self-aligned to the trench.

Figure 2H:
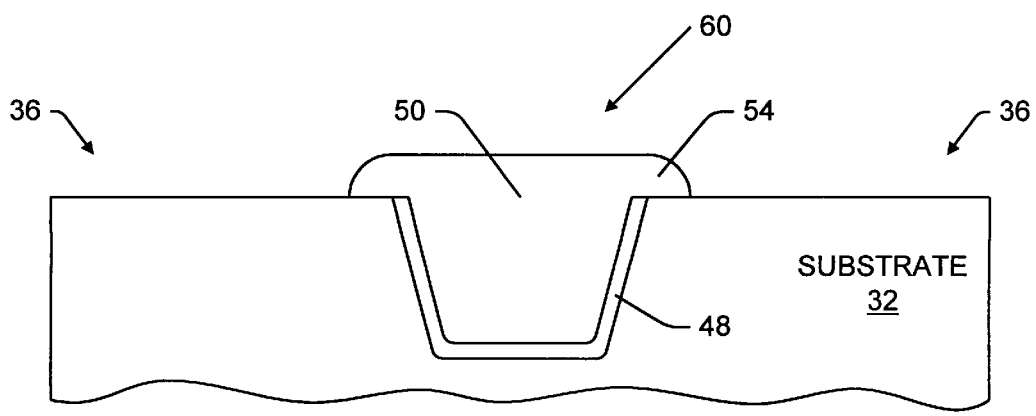

Typically, a wet etch is then performed to remove the remaining portion of the insulating layer 30 which results in the structure of FIG. 2H. The isolating material disposed in the trench combines with the spacer 54 to form an isolation trench having a cap or dome-like covering 60 and a smooth profile. The cap 60 extends over the peripheral edges of the trench, thereby substantially overcoming the "corners" effect, and substantially reducing current leakage between the active areas 36 on the substrate.

A problem arises in the prior art STI fabrication process because it is not easy to control the dry etching process for forming the spacer 54. Referring to FIG. 2F, assuming that the third oxide layer 52 and insulating layer 30 comprise oxide, it is not easy to control the dry etching for forming the spacer 54 due to the selectivity etch ratio. Because this dry etching process is not easy to control, the insulating layer 30 is penetrated which results in damage to the active areas 36.

What is needed is an STI fabrication process which is easier to control than prior art processes.

SUMMARY OF THE INVENTION

It is an object of the present invention to provide a process of fabricating a shallow trench isolation structure wherein the process is easily controlled.

Briefly, a presently preferred embodiment of the present invention provides an improved process of fabricating a shallow trench isolation structure. A semiconductor substrate is provided and an insulating layer is formed over the substrate. A nitride masking layer is formed over the insulating layer. The nitride masking layer and the insulating layer are patterned and etched to expose a portion of the substrate, and to expose edges of the nitride masking layer and the insulating layer. The exposed portion of the substrate substantially defines boundaries of the isolation structure.

A first oxide layer is deposited superjacent the exposed portion of the substrate, and over the nitride masking layer. A removing step includes removing portions of the first oxide layer lying over the nitride masking layer, a central portion of the first oxide layer superjacent the substrate, and a portion of the substrate to form a trench, leaving an oxide spacer disposed between the exposed edges of the nitride masking layer and the insulating layer, and the edge of the trench.

Next, a second oxide layer is formed on the interior surface of the trench. An insulating material is then deposited into the trench, over the spacer, and over the first oxide layer to form a third oxide layer. The third oxide layer is planarized to expose the nitride masking layer. The nitride masking layer is removed, and then the insulating layer is removed. Finally, the third oxide layer is smoothed to form the trench isolation structure.

The STI fabrication process of the present invention provides advantages over prior art STI fabrication processes.

The process of the present invention is easier to control than prior art processes. The resulting STI allows for IC devices which do not suffer from excessive current leakage between active areas.

The foregoing and other objects, features, and advantages of the present invention will be apparent from the following detailed description of the preferred embodiment which makes reference to the several figures of the drawing.

IN THE DRAWINGS

FIG. 1 is a cross-sectional view of a typical prior art shallow trench isolation (STI) structure including isolation material deposited within a trench, the STI structure having a recess formed at corners between the isolation material and the edge of the trench;

FIGS. 2A through 2H are cross-sectional views illustrating a progression of manufacturing steps in accordance with a prior art process of manufacturing an STI structure having a smooth trench profile achieved by forming spacers around the periphery of the trench to form a dome like structure over the trench; and FIGS. 3A through 3I are cross-sectional views illustrating a progression of manufacturing steps in accordance with an improved process of manufacturing an STI structure in accordance with the present invention.

DETAILED DESCRIPTION OF THE PREFERRED EMBODIMENTS

FIGS. 3A through 3I are cross-sectional views illustrating a progression of manufacturing steps in accordance with a process of manufacturing a shallow trench isolation structure in accordance with the present invention.

Figure 3A:
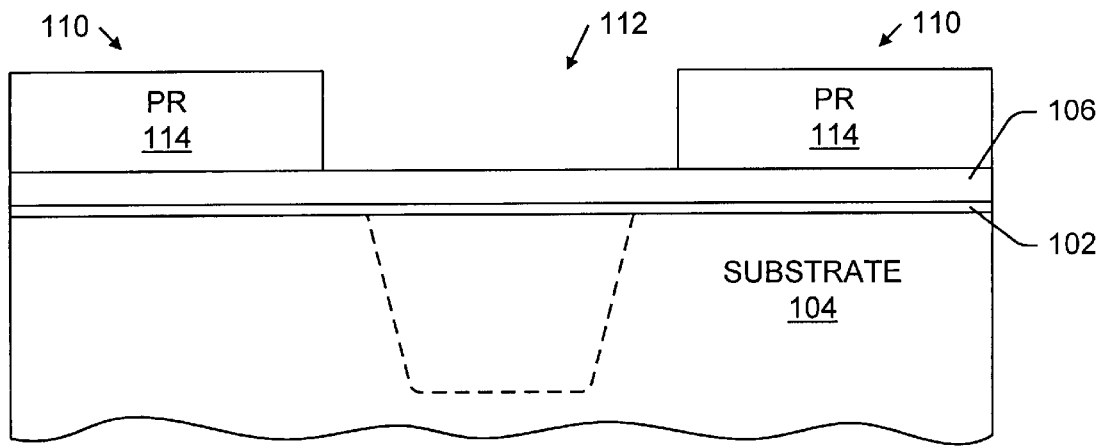

Referring to FIG. 3A, an insulating layer 102 is formed over a semiconductor substrate 104 in accordance with initial steps of the process of manufacturing an STI structure in accordance with the present invention. The insulating layer 102 is typically formed using an oxide, commonly referred to as a pad oxide. However, other suitable insulating materials are also known to be used. A nitride masking layer 106 is disposed over the insulating layer 102. Although the masking layer 106 is usually formed from a non-reactive material using oxygen or hydro-oxide, any material having similar characteristics may also be used to form the masking layer 106. Additionally, the masking layer 106 may be formed using a material having insulative properties (e.g., silicon nitride), or may be formed using conductive materials such as polysilicon and polysilicon/nitride. Initial steps in defining active areas 110 and trench areas 112 of the semiconductor substrate 104 include applying a photo-resistive mask 114 over the nitride masking layer 106.

Figure 3B:
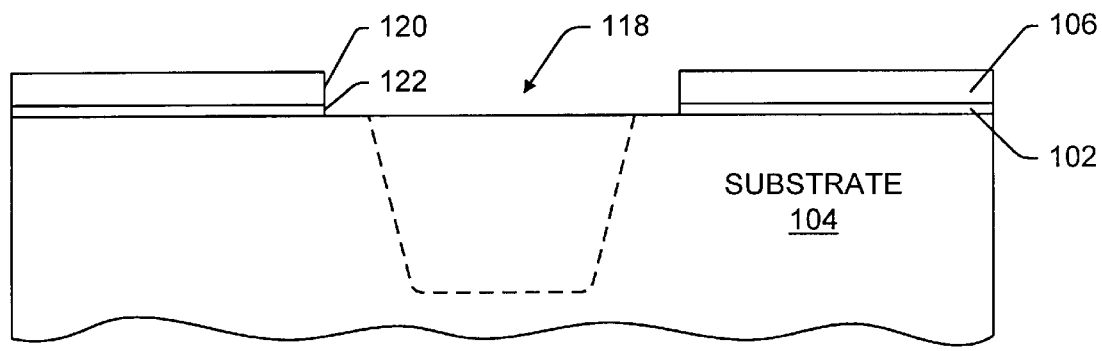

Referring to FIG. 3B, a photolithographic step is performed to remove portions of the nitride masking layer 106 and insulating layer 102 in the trench area 112, thereby exposing a portion 118 of the substrate 104. After removing portions of the masking layer 106 and insulation layer 102 in the trench area 112, the photo-resistive mask 114 (FIG. 3A) on the nitride masking layer 106 is removed as shown. As a result of the etching step, edges 120 and 122 of the nitride masking layer 106 and insulating layer 102 are exposed.

Figure 3C:
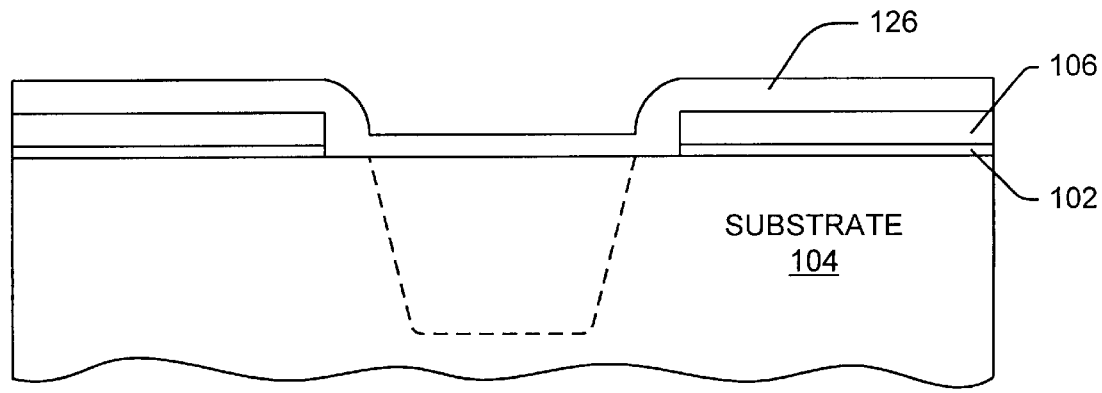

Referring to FIG. 3C, a first oxide layer 126 is deposited superjacent the exposed portion 118 of the substrate, and over the nitride masking layer 106. The step of depositing the first oxide layer 126 is preferably performed in accordance with a chemical vapor deposition (CVD) process. The CVD process may include low pressure chemical vapor deposition (LPCVD), plasma enhanced chemical vapor deposition (PECVD), or high density plasma CVD. The first oxide layer 126, which provides insulation, may be formed by silicon dioxide (SiO$_2$), tetraethyl orthosilicate (TEOS), or any other suitable material.

Figure 3D:
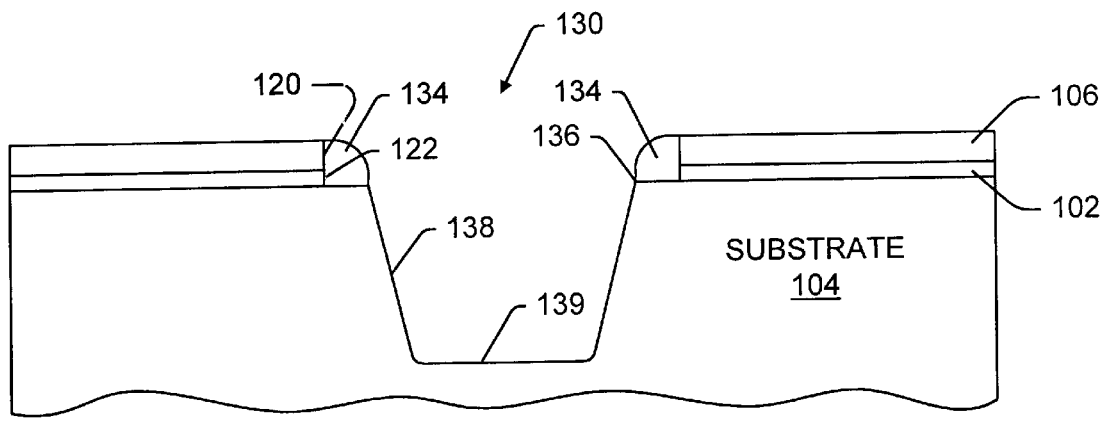

Referring to FIGS. 3C and 3D, further steps in the STI fabrication process of the present invention include: using a reactive ion etching (RIE) process to remove portions of the first oxide layer 126 (FIG. 3C) lying over the nitride masking layer 106, a central portion of the first oxide layer 126 superjacent the substrate 104, and a portion of the substrate 104 to form a trench 130 (FIG. 3D) in the substrate 104, while leaving an oxide spacer 134 disposed between the edges 120 and 122 of the nitride masking layer 106 and insulating layer 102, and an edge 136 of the trench 130. Trench 130 has a sidewall 138 and a bottom 139. Spacer 134 protects the upper corner of the trench 130 thereby providing an advantage over the prior art process.

Figure 3E:
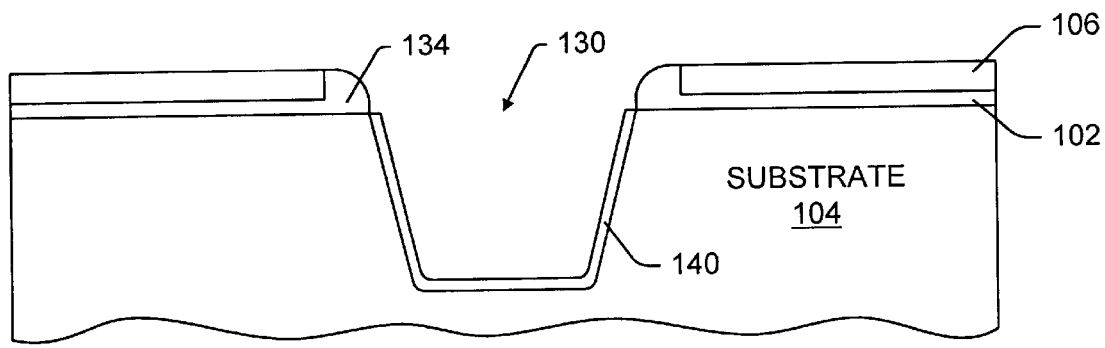

Referring to FIG. 3E, a second oxide layer 140 is grown or deposited in the trench 130, thereby lining the interior surface including the sidewall 138 and bottom 139 of the trench 130 and providing greater resistance to cracking, and for passivating the trench sidewalls. The second oxide layer 140 is preferably formed in the trench 130 using a rapid thermal oxidation (RTO) process, or thermal oxide.

Figure 3F:
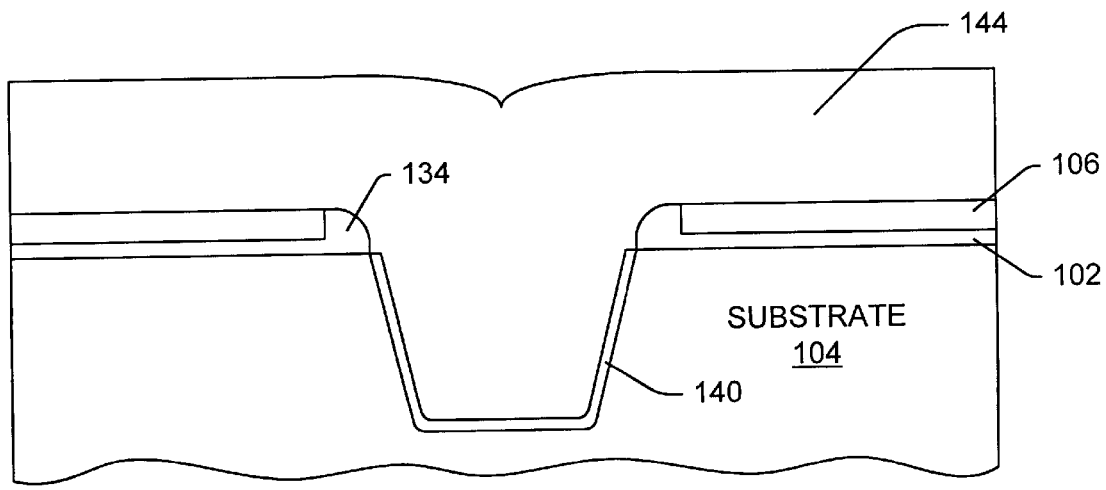

Referring to FIG. 3F, a third oxide layer 144 is deposited in the trench 130, and over the remaining portions of the nitride masking layer 106. The third oxide layer 144 fimctions as an insulator, thereby providing isolation of the various electrical devices which may be fabricated on the substrate 104. Any suitable material having insulative characteristics may also be used to form the third oxide layer 144. The step of depositing the third oxide layer 144 is preferably performed in accordance with a chemical vapor deposition (CVD) process. The CVD process may include LPCVD, PECVD, high density plasma CVD, or any combination thereof.

In the preferred embodiment, each of the first, second, and third oxide layers 126 (FIG. 3C), 140, and 144 has substantially similar chemical properties.

Figure 3G:
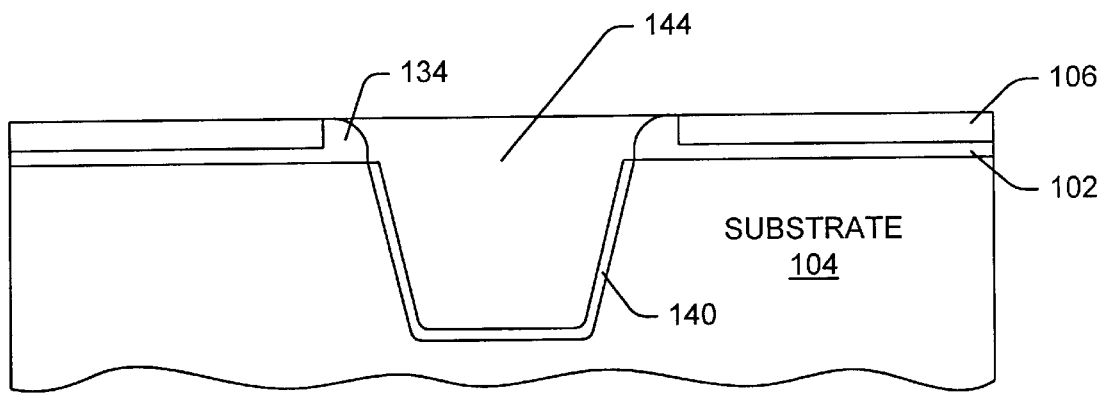

FIG. 3G shows a cross-sectional view of the STI structure of FIG. 3F after performance of a planarization step to remove a portion of the third oxide layer 144, exposing the nitride masking layer 106. The planarization step may be accomplished using any of a variety of suitable methods, such as chemical-mechanical polishing (CMP), dry etching, or a combination thereof.

Figure 3H:
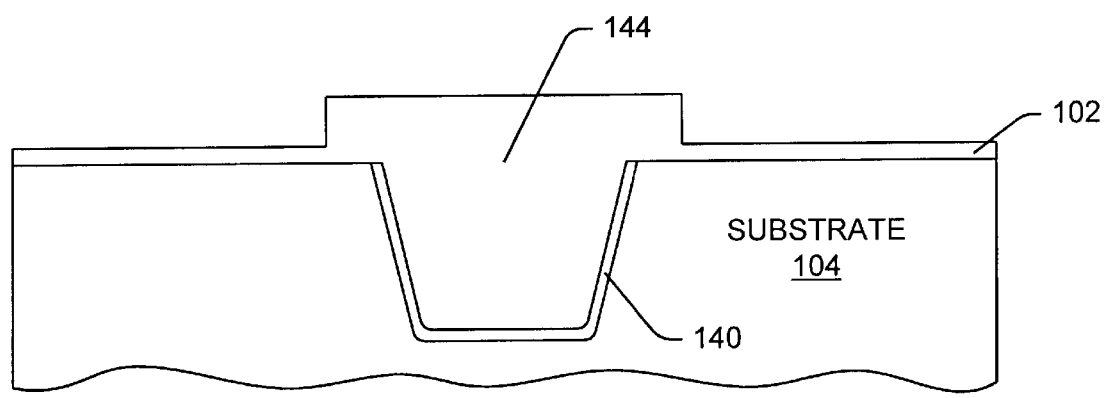

The structure of FIG. 3H results after the nitride masking layer 106 is removed via a wet etching step. A portion of the third oxide layer 144 combined with the spacer 134 (FIG. 3G) protrudes upward from the substrate 104.

Figure 3I:
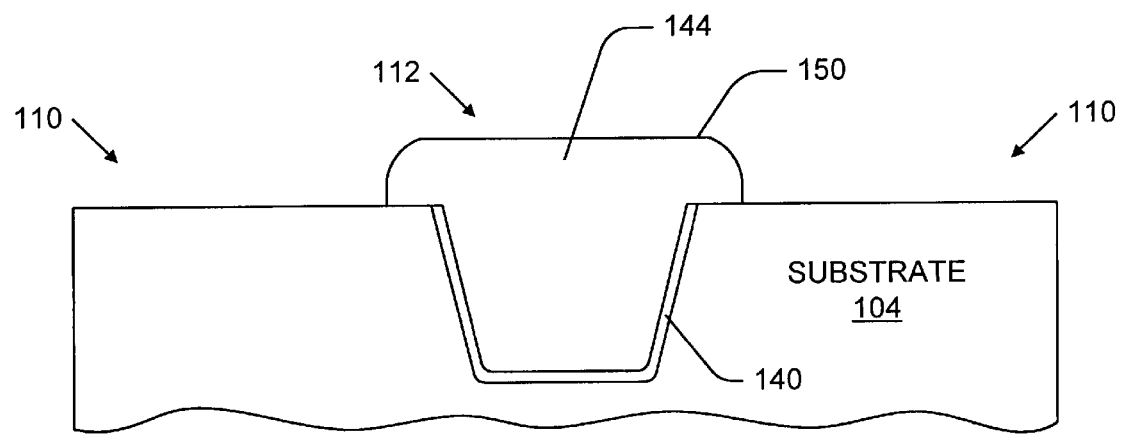

The structure of FIG. 3I results after the insulating masking layer 102 is removed via a wet etching step, and the third oxide layer 144 is smoothed to form an isolation trench having a cap, or dome-like covering, 150. The cap 150 has a smooth profile. The isolating material of the third oxide layer 144 disposed in the trench combines with the spacer 134 (FIG. 3G) to form the cap 150 which extends over the peripheral edge of the trench, thereby substantially overcoming the "corners" effect, and substantially reducing current leakage between the active areas on the substrate.

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A process of fabricating a shallow trench isolation structure comprising the steps of:

providing a substrate;

forming an insulating layer over said substrate;

forming a nitride masking layer over said insulating layer;

patterning and etching said nitride masking layer and said insulating layer to expose a portion of said substrate, and to expose edges of said nitride masking layer and said insulating layer, said exposed portion of said substrate substantially defining boundaries of the isolation structure;

depositing a first oxide layer superjacent said exposed portion of said substrate, and over said nitride masking layer;

removing portions of said first oxide layer lying over said nitride masking layer, a central portion of said first oxide layer superjacent said substrate, and a portion of said substrate to form a trench having a sidewall and a bottom, leaving an oxide spacer disposed between said exposed edges of said nitride masking layer and said insulating layer, and the edge of said trench;

forming a second oxide layer on the sidewall and bottom of said trench;

depositing an insulating material into said trench, over said spacer, and over said first oxide layer to form a third oxide layer;

planarizing said third oxide layer to expose said nitride masking layer;

removing said nitride masking layer;

removing said insulating layer; and smoothing said third oxide layer and only a portion of said spacer to form the trench isolation structure.

2. A process of fabricating a shallow trench isolation structure as recited in claim 1 wherein said step of depositing said first oxide layer includes performing a deposition process selected from the group consisting of low pressure chemical vapor deposition, plasma enhanced chemical vapor deposition, and high density plasma chemical vapor deposition.

3. A process of fabricating a shallow trench isolation structure as recited in claim 1 wherein said first oxide layer includes a material selected from the group consisting of silicon dioxide and tetraethyl orthosilicate.

4. A process of fabricating a shallow trench isolation structure as recited in claim 1 wherein said step of etching said nitride masking layer and said insulating layer includes performing reactive ion etching.

5. A process of fabricating a shallow trench isolation structure as recited in claim 1 wherein said step of forming said second oxide layer includes performing rapid thermal oxidation.

6. A process of fabricating a shallow trench isolation structure as recited in claim 1 wherein said step of depositing an insulating material into said trench includes performing a deposition process selected from the group consisting of low pressure chemical vapor deposition, plasma enhanced chemical vapor deposition, and high density plasma chemical vapor deposition.

7. A process of fabricating a shallow trench isolation structure as recited in claim 1 wherein each of said first, second, and third oxide layers has substantially similar chemical characteristics.

8. A process of fabricating a shallow trench isolation structure as recited in claim 1 wherein said step of planarizing said third oxide layer includes performing chemical mechanical polishing.

9. A process of fabricating a shallow trench isolation structure as recited in claim 1 wherein said step of planarizing said third oxide layer includes performing dry etching.

10. A process of fabricating a shallow trench isolation structure as recited in claim 1 wherein said step of removing said nitride masking layer includes performing wet etching.

11. A process of fabricating a shallow trench isolation structure as recited in claim 1 wherein said step of removing said insulating layer includes performing wet etching.

12. A process of fabricating a shallow trench isolation structure as recited in claim 1 wherein said insulating layer is a pad oxide layer.

13. A process of fabricating a shallow trench isolation structure as recited in claim 1 wherein said nitride masking layer is a silicon nitride layer.

14. A process of fabricating a shallow trench isolation structure comprising the steps of:

forming a masking layer on a substrate;

patterning and etching said masking layer to expose a portion of said substrate, and to expose edges of said masking layer, said exposed portion of said substrate substantially defining boundaries of the isolation structure;

depositing a first oxide layer superjacent said exposed portion of said substrate, and over said masking layer;

removing portions of said first oxide layer lying over said masking layer, a central portion of said first oxide layer superjacent said substrate, and a portion of said substrate to form a trench having a sidewall and a bottom, leaving an oxide spacer disposed between said exposed edges of said masking layer, and the edge of said trench;

forming a second oxide layer on the surface of the sidewall and bottom said trench;

depositing an insulating material into said trench, over said spacer, and over said first oxide layer to form a third oxide layer;

planarizing said third oxide layer to expose said nitride masking layer;

removing said masking layer; and smoothing said third oxide layer and only a portion of said spacer to form the trench isolation structure.

15. A process of fabricating a shallow trench isolation structure as recited in claim 14 wherein said step of depositing said first oxide layer includes performing a deposition process selected from the group consisting of low pressure chemical vapor deposition, plasma enhanced chemical vapor deposition, and high density plasma chemical vapor deposition.

16. A process of fabricating a shallow trench isolation structure as recited in claim 14 wherein said first oxide layer includes a material selected from the group consisting of silicon dioxide and tetraethyl orthosilicate.

17. A process of fabricating a shallow trench isolation structure as recited in claim 14 wherein said step of etching said masking layer and said insulating layer includes performing reactive ion etching.

18. A process of fabricating a shallow trench isolation structure as recited in claim 14 wherein said step of forming said second oxide layer includes performing rapid thermal oxidation.

19. A process of fabricating a shallow trench isolation structure as recited in claim 14 wherein said step of depositing an insulating material into said trench includes performing a deposition process selected from the group consisting of low pressure chemical vapor deposition, plasma enhanced chemical vapor deposition, and high density plasma chemical vapor deposition.

20. A process of fabricating a shallow trench isolation structure as recited in claim 14 wherein each of said first, second, and third oxide layers has substantially similar chemical characteristics.

21. A process of fabricating a shallow trench isolation structure as recited in claim 14 wherein said step of planarizing said third oxide layer includes performing chemical mechanical polishing.

22. A process of fabricating a shallow trench isolation structure as recited in claim 14 wherein said step of planarizing said third oxide layer includes performing dry etching.

* * * * *